(12) United States Patent
Di Dihuweii et al.

(10) Patent No.: US 11,758,674 B2
(45) Date of Patent: Sep. 12, 2023

(54) LATCH WITH MOVABLE HANDLE FOR ELECTRONIC EQUIPMENT

(71) Applicant: DELL PRODUCTS, LP, Round Rock, TX (US)

(72) Inventors: Harris Di Dihuweii, Shanghai (CN); Yuxin Chen, Shanghai (CN); Qingqiang Guo, Shanghai (CN); Zhiwen Jiang, Shanghai (CN); Jie Yang, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 9 days.

(21) Appl. No.: 17/191,363

(22) Filed: Mar. 3, 2021

(65) Prior Publication Data

US 2022/0248546 A1 Aug. 4, 2022

(30) Foreign Application Priority Data

Feb. 3, 2021 (CN) .......................... 202110156988.0

(51) Int. Cl.
*H05K 5/02* (2006.01)
*G06F 1/18* (2006.01)
*H05K 7/14* (2006.01)

(52) U.S. Cl.
CPC ............. *H05K 5/023* (2013.01); *G06F 1/187* (2013.01); *H05K 7/1489* (2013.01)

(58) Field of Classification Search
None
See application file for complete search history.

(56) References Cited

U.S. PATENT DOCUMENTS

| 4,006,951 | A | 2/1977 | Geer et al. | |
|---|---|---|---|---|
| 9,161,476 | B2 | 10/2015 | Doglio et al. | |
| 9,681,574 | B1* | 6/2017 | Chen | H05K 7/1489 |
| 10,667,424 | B2* | 5/2020 | Lin | H05K 7/1411 |
| 2007/0223204 | A1* | 9/2007 | Makabe | H05K 5/023 361/756 |
| 2013/0176690 | A1* | 7/2013 | Sun | H05K 5/023 361/747 |
| 2018/0157295 | A1* | 6/2018 | Zhu | H05K 5/023 |
| 2020/0396858 | A1* | 12/2020 | Wu | H05K 7/1489 |
| 2021/0198926 | A1* | 7/2021 | Tsorng | G06F 1/186 |

* cited by examiner

*Primary Examiner* — James Wu
*Assistant Examiner* — Christopher L Augustin
(74) *Attorney, Agent, or Firm* — Larson Newman, LLP

(57) ABSTRACT

An information handling system includes a module configured to be installed into a server rack and a handle assembly. The handle assembly includes a main frame that is rigidly affixed to the module, a handle frame that is movably affixed to the main frame, and a handle that is rigidly affixed to the handle frame. The handle frame and the handle are movable with respect to the main frame between a first, upper position, and a second, lower position.

14 Claims, 3 Drawing Sheets

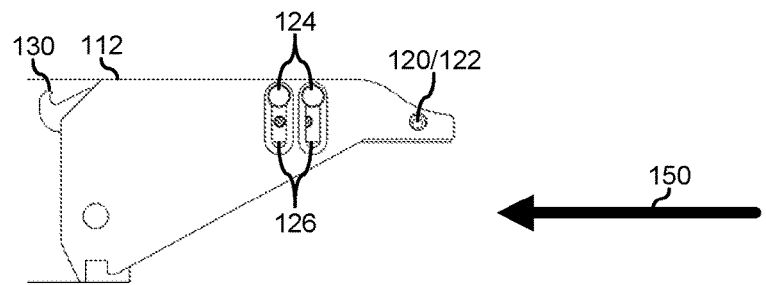
110 Raised Position
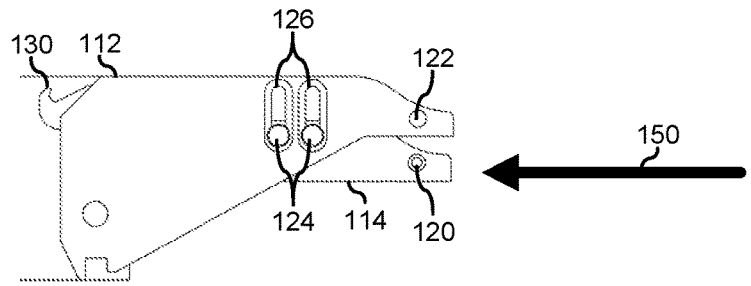
110 Lowered Position
*FIG. 2*
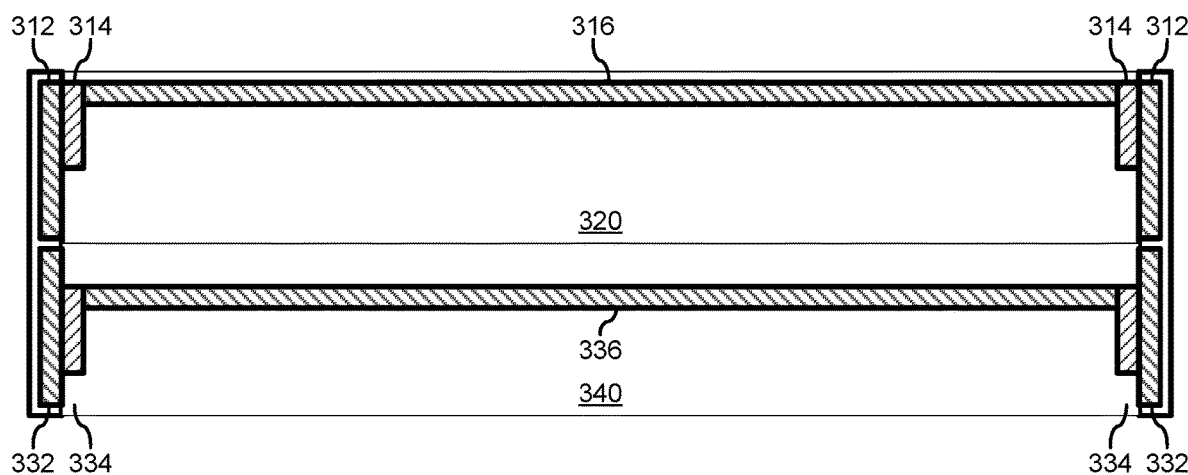
300    *FIG. 3*

LATCH WITH MOVABLE HANDLE FOR ELECTRONIC EQUIPMENT

CROSS REFERENCE TO RELATED APPLICATIONS

The present application claims priority from Chinese Patent Application No. 202110156988.0, filed Feb. 3, 2021, entitled "Latch with Movable Handle for Electronic Equipment," which is assigned to the current assignee hereof and incorporated herein by reference in its entirety.

FIELD OF THE DISCLOSURE

This disclosure generally relates to information handling systems, and more particularly relates to providing a latch with a movable handle for electronic equipment in a server rack.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a module configured to be installed into a server rack and a handle assembly. The handle assembly may include a main frame that is rigidly affixed to the module, a handle frame that is movably affixed to the main frame, and a handle that is rigidly affixed to the handle frame. The handle frame and the handle may be movable with respect to the main frame between a first, upper position, and a second, lower position.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 2 shows side views of the latch of FIG. 1;

FIG. 3 illustrates a server rack with modules that includes latches with movable handles.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
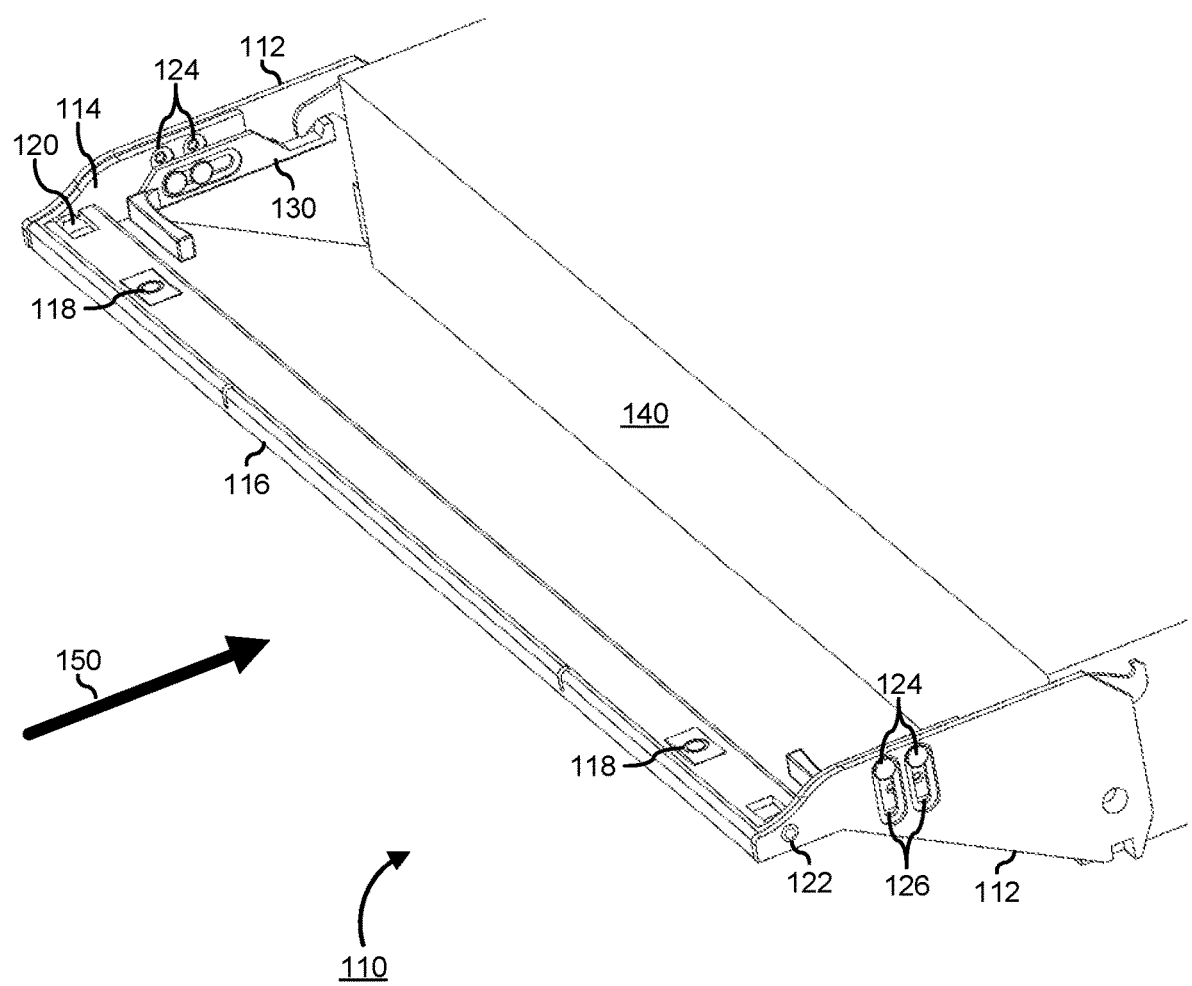
FIG. 1 is a perspective view of an element of electronic equipment with a latch with a movable handle according to an embodiment of the current disclosure.

FIG. 1 illustrates a component of server rack mountable equipment 100 including module 140 with a latch/handle assembly 110 affixed thereto. For the purposes of the current disclosure, a server rack will be understood to represent a standardized frame for the mounting of equipment 100, for example of processing systems of a data center. An exemplary server rack may include a standard frame for mounting processing systems in accordance with an Electronic Industries Alliance specification EIA-310-D, *Cabinets, Racks, Panels, and Associated Equipment*. As such, a server rack can be twenty-four inches wide, forty inches deep, and can vary in height from forty-eight to eighty-four inches or more, and can accommodate the mounting of equipment 100 that has a front panel that is nineteen inches wide. Further, equipment 100 can be configured with front panel height that is defined in terms of a rack unit (U) of two (2) inches. That is, where equipment 100 is two (2) inches high, the equipment is referred to as "1U" equipment, where the equipment is four (4) inches high, the equipment is referred to as "2U" equipment, and so on. Moreover, a server rack can define locations within the server rack for mounting equipment 100 in terms of rack units (U). For example, a lowermost mounting location in a server rack can be designated as "U1," a next lowermost mounting location in the server rack can be designated as "U2," and so on. Other examples of standardized frames can include a European Telecommunications Standards Institute (ETSI) standard ETS 300 119, a Western Electric standard twenty-three inch frame, an Open Rack mounting system in accordance with an Open Compute Project, or another standardized frame, as needed or desired.

In a particular embodiment, module 140 represents a module that is installed into a back side of equipment 100, and that provides one of a variety of modular functions to the equipment. For example, module 100 may represent a power supply module, an input/output module, such as a network or storage interface module, a processing module, or the like, as needed or desired. As such, the height and width of module 140 may be slightly smaller than the height and width of equipment 100, such that the back side of the equipment accommodates only one (1) module, or the height and width of the module may be some fraction of the height and width of the equipment, such that the back side of the equipment accommodates two or more modules arranged side-be-side, or two or more modules arranged one atop the other. Thus latch/handle 110 will be understood to roughly as wide as the associated module 140 to which the latch/handle is affixed. Here, latch/handle 140 will be understood to be affixed to module 140 by screws, or nuts and bolts securing the latch handle to a frame of the module, by welding, soldering, gluing, to the frame, by being formed as a portion of the frame, or by other mechanisms, as needed or desired.

Latch/handle 110 includes right- and left-main frames 112, right- and left-handle frames 114, a handle 116, right- and left-release buttons 118, right- and left-release pins 120, right- and left-slide pins 124, and right- and left-latches 130. Each main frame 112 includes a pin hole 122 and slots 126. Hereinafter, the description will be limited to discussing a single side, but the description will be understood to apply to the opposite side as well, unless otherwise indicated. Main frame 112 is rigidly affixed to module 140, as described above. On the inner side of main frame 112, handle frame 114 is movably affixed to the main frame. In particular, slide pins 124 are rigidly affixed to handle frame 114, and the slide pins extend through slots 126, thereby permitting the handle frame to move upwards and downwards with respect to main frame 112. Handle 116 is rigidly affixed to right- and left-handle frames 114 such that, as the handle frames move with respect to main frame 112, the handle also moves upwards and downwards with respect to the main frame. Here, slots 124 are configured to allow a maximum movement of handle frames 112 and handle 116 with respect to main frames 112. For example, slots 124 may be configured to allow handle frames 112 and handle 116 to move one (1) centimeter upwards and downwards with respect to main frames 112, or may be configured to allow a greater distance or a lesser distance of travel with respect to the main frames, as needed or desired.

In a particular embodiment, when handle frames 114 and handle 116 are in the upper position, the handle frames and the handle are maintained in the upper position by the insertion of release pins 120 into pin holes 122. Thus, when release pins 120 are inserted into pin holes 122, handle frames 114 and handle 118 are prevented from moving out of the upper position. Release buttons 118 are arranged such that the engagement of the release buttons, for example by depressing the release buttons, operates to retract respective release pins 120 from respective pin holes, thereby permitting the lowering of handle frames 112 and handle 116 into the lower position. For example, handle 116, release buttons 118, and release pins 120 can be configured such that a downward motion of release button 118 is mechanically translated into an inward motion of respective release pin 120. In another embodiment, not illustrated, release buttons 118 are replaced by slide buttons which are rigidly affixed to the respective release pins, and are positioned within slots within handle 116, such that when the slide buttons are slid inwards in the slots, the release pins are disengaged from the respective pin holes, permitting the downward motion of handle frames 114 and handle 116. In another embodiment, handle frames 114 and handle 116 are located in the lower position when release pins 120 are inserted into pin holes 122, and the activation of release buttons 118 and the consequent retraction of the release pins from the pin holes permits the upward motion of the handle frames and the handle.

Latches 130 operate to engage with locking structures of the server rack or server rack rails installed into the server rack to mechanically secure equipment 100 from moving with respect to the server rack. Here, in a first position, latches 130 permit the installation and removal of equipment 100 to the server rack. In a second position, latches 130 mechanically secure equipment 100 from moving with respect to the server rack. The mechanisms of mechanically locking equipment to a server rack are known in the art and will not be further described herein, except as needed to illustrate the current embodiments.

FIG. 2 is a side view, for example, a left-side view of latch/handle assembly 110. Here, in the upper position, release pin 120 is inserted into pin hole 122, and handle frame 114 and handle 116 are in the upper position, hidden from view behind main frame 112. This can also be observed by the fact that slide pins 124 are located at the top side of slots 126. In the lower position, release pine 120 is retracted from pin hole 122, and handle frame 114 and handle 116 are permitted to move to the lower position, being seen behind and below main frame 112. This can also be observed by the fact that slide pins 124 are located at a bottom side of slots 126.

FIG. 3 illustrates a portion of a server rack 300 with modules 320 and 340 installed therein. Module 320 is illustrated with a simplified illustration of a latch/handle assembly affixed thereto, including main frames 312, handle frames 314, and a handle 316. Here, handle frames 314 and handle 316 are illustrated in the upper position. Module 340 is illustrated with a simplified illustration of a latch/handle assembly affixed thereto, including main frames 332, handle frames 334, and a handle 336. Here, handle frames 334 and handle 336 are illustrated in the lower position. Here, it may be understood that other server rack equipment may be located above module 320 that make the grasping and handling of handle 316 awkward. For example, where an element of server rack equipment that is above module 320 includes multiple network cables that drape downward, it may be difficult to grasp handle 316 because the network cables are in the way. However, by activating a release mechanism within handle 316, for example a release button or a release slide, handle frames 314 and handle 316 can be lowered into the lower position, similar to that shown for handle frames 334 and handle 336, to provide more space for grasping the handle to remove or install module 320.

The current embodiments provide for improved accessibility over various prior art solutions. For example, in a particular prior art solution, a latch/handle mechanism for a module is located along a top of the module, and rotates outward to unlock the module from the server rack, and to provide handles for grasping. However, here, the presence of the latch/handle mechanisms along the top of the module also limits the amount of space permitted for air flow from the rear of the module, and may also limit the effective height of the module for the inclusion of connectors, fans, or other elements at the back of the module. In the present embodiment, an air flow 150 (as illustrated in FIGS. 1 and 2) is not impeded because the handle is moved away from the back of the module and the air from the module can flow around the handle. Moreover, the handle does not limit the effective height of the module in terms of the connectors, fans, or other elements at the back of the module.

Figure 4:
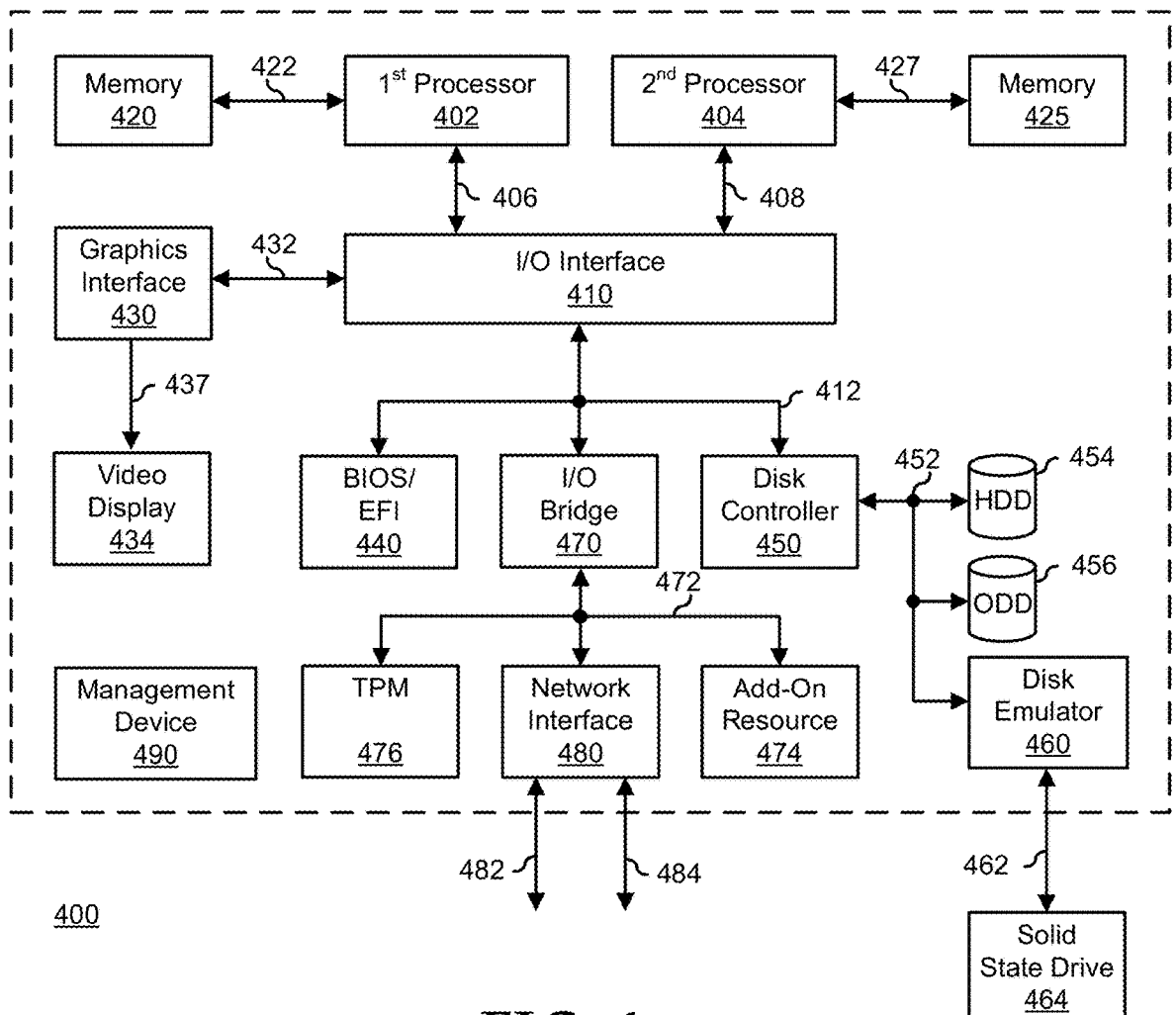
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
    a module configured to be installed into a server rack; and
    a handle assembly including a main frame that is rigidly affixed to the module, a handle frame that is movably affixed to the main frame, and a handle that is rigidly affixed to the handle frame, wherein the handle frame and the handle are linearly movable with respect to the main frame between a first position and a second position, wherein in the first position, the handle frame and the handle are raised within an air flow provided to the module, and in the second position, the handle frame and the handle are lowered into the air flow, wherein the handle assembly further includes a latch to retain the module in the server rack.

2. The information handling system of claim 1, wherein the handle includes a release mechanism.

3. The information handling system of claim 2, wherein the release mechanism maintains the handle frame and the handle in the first position when the release mechanism is in a first state.

4. The information handling system of claim 3, wherein the release mechanism releases the handle frame and the handle to move into the second position when the release mechanism is in a second state.

5. The information handling system of claim 4, wherein the handle further includes a release pin coupled to the release mechanism.

6. The information handling system of claim 5, wherein, when the release mechanism is in the first state, the release pin is inserted into a pin hole in the main frame to maintain the handle frame and the handle in the first position.

7. The information handling system of claim 6, wherein, when the release mechanism is in the second state, the release pin is removed from the pin hole to release the handle frame and the handle to move into the second position.

8. The information handling system of claim 4, wherein the release mechanism includes a release button, wherein the release mechanism is in the first state when the release button is not depressed and the release mechanism is in the second state when the release button is depressed.

9. The information handling system of claim 4, wherein the release mechanism includes a release slide, wherein the release mechanism is in the first state when the release slide is in a first position and the release mechanism is in the second state when the release slide is in a second position.

10. A method, comprising:
    rigidly affixing a main frame to a module, the module configured to be installed into a server rack;
    movably affixing a handle frame of a handle assembly to the main frame;
    rigidly affixing a handle to the handle frame, wherein the handle frame and the handle are linearly movable with respect to the main frame between a first position and a second position, wherein in the first position, the handle frame and the handle are raised within an air flow provided to the module, and in the second position, the handle frame and the handle are lowered into the air flow, wherein the handle includes a release mechanism, and wherein the handle further includes a release pin coupled to the release mechanism;
    maintaining, by the release mechanism, the handle frame and the handle in the first position when the release mechanism is in a first state;
    releasing, by the release mechanism, the handle frame and the handle to move into the second position when the release mechanism is in a second state; and
    inserting the release pin into a pin hole in the main frame to maintain the handle frame and the handle in the first position when the release mechanism is in the first state.

11. The method of claim 10, further comprising removing the release pin from the pin hole to release the handle frame and the handle to move into the second position when the release mechanism is in the second state.

12. The method of claim 10, wherein the release mechanism includes a release button, wherein the release mechanism is in the first state when the release button is not depressed and the release mechanism is in the second state when the release button is depressed.

13. The method of claim 10, wherein the release mechanism includes a release slide, wherein the release mechanism is in the first state when the release slide is in a first position and the release mechanism is in the second state when the release slide is in a second position.

14. A handle assembly for a module configured to be installed into a server rack, the handle assembly comprising:
   a first main frame that is rigidly affixed to a first side of the module;
   a second main frame that is rigidly affixed to a second side of the module;
   a first handle frame that is movably affixed to the first main frame;
   a second handle frame that is movably affixed to the second main frame; and
   a handle that is rigidly affixed between the first handle frame and the second handle frame, wherein the first handle frame, the second handle frame, and the handle are linearly movable with respect to the first main frame and the second main frame between a first position and a second position, wherein in the first position, the first handle frame, the second handle frame, and the handle are raised within an air flow provided to the module, and in the second position, the first handle frame, the second handle frame, and the handle are lowered within the air flow, wherein the handle assembly further includes a latch to retain the module in the server rack.

* * * * *